United States Patent [19]
Dydyk

[11] Patent Number: 5,617,065
[45] Date of Patent: Apr. 1, 1997

[54] FILTER USING ENHANCED QUALITY FACTOR RESONATOR AND METHOD

[75] Inventor: Michael Dydyk, Scottsdale, Ariz.

[73] Assignee: Motorola, Inc., Schaumburg, Ill.

[21] Appl. No.: 496,837

[22] Filed: Jun. 29, 1995

[51] Int. Cl.⁶ ................................................. H03H 9/00
[52] U.S. Cl. ........................... 333/186; 310/321; 333/187
[58] Field of Search .................................. 333/186–192; 310/321, 324

[56] References Cited

U.S. PATENT DOCUMENTS

| 3,313,959 | 4/1967 | Dill | 307/88.5 |
|---|---|---|---|
| 3,414,832 | 12/1968 | Newell | 330/286 |
| 3,624,564 | 11/1971 | Ise et al. | 333/192 |
| 3,983,518 | 9/1976 | Bezemer | 333/191 |
| 4,166,967 | 9/1979 | Benes et al. | 310/338 |
| 4,456,850 | 6/1984 | Inoue et al. | 310/324 |
| 4,502,932 | 3/1985 | Kline et al. | 204/192 |
| 4,556,812 | 12/1985 | Kline et al. | 310/324 |
| 4,616,152 | 10/1986 | Saito et al. | 310/324 |
| 4,640,756 | 2/1987 | Wang et al. | 204/192.18 |
| 4,641,054 | 2/1987 | Takahata et al. | 310/324 |
| 4,642,508 | 2/1987 | Suzuki et al. | 310/321 |
| 4,672,591 | 6/1987 | Breimesser et al. | 367/152 |
| 4,719,383 | 1/1988 | Wang et al. | 310/324 |
| 4,749,900 | 6/1988 | Hadimioglu et al. | 310/334 |
| 5,011,568 | 4/1991 | Braymen et al. | 156/647 |
| 5,075,641 | 12/1991 | Weber et al. | 331/108 |
| 5,162,691 | 11/1992 | Mariani et al. | 310/321 |
| 5,218,328 | 6/1993 | Morita et al. | 333/187 |
| 5,307,034 | 4/1994 | Morita et al. | 333/187 |
| 5,369,382 | 11/1994 | Arvanitis | 333/189 |
| 5,373,268 | 12/1994 | Dworsky et al. | 333/187 |

FOREIGN PATENT DOCUMENTS 57-19114  8/1983  Japan.
60-72277  4/1985  Japan.

OTHER PUBLICATIONS

"Face–Mounted Piezoelectric Resonators" by W.E. Newell, Senior Member, IEEE, 1965.
"Performance of Single–Crystal LiNbO₃ Transducers Operating Above 1 GHz" by Naoya Uchida, Syuzo Fukunishi and Shoichi Saito from IEEE, 1973.
"Fabrication of Wideband Bragg Cells Using Thermocompression Bonding and Ion Beam Milling" by Joel Rosenaum, Michael G. Price, Rob Bonney and Otis G. Zehl, Members of IEEE, from IEEE, 1985.
"Ultrasonically Welded Piezoelectric Transducers" by John D. Larson, III and D.K. Winslow, Members of IEEE, from IEEE, 1971.

Primary Examiner—Benny T. Lee
Assistant Examiner—Darius Gambino
Attorney, Agent, or Firm—Frederick M. Fliegel

[57] ABSTRACT

A filter (500) including a first resonator (505) coupled in shunt with a first port (507), a first bridging network (510) coupled between the first port (507) and a first node (509), a second resonator (515) coupled in shunt with the first node (509) and a second port (547) coupled to the first node (509). The first (505) and second (515) resonators each include acoustic resonators (15) and the first bridging network (510) has an electrical length $\Theta$ at a frequency $\omega$ in a system having a characteristic admittance Y in accordance with $\omega C_o = Y \cot \Theta$ where $C_o$ is a shunt capacitance including the clamping capacitance of the first resonator (505) and $\omega$ is a center frequency of the filter (500).

19 Claims, 3 Drawing Sheets

FILTER USING ENHANCED QUALITY FACTOR RESONATOR AND METHOD

CROSS-REFERENCE TO RELATED APPLICATIONS

This application is related to co-pending U.S. patent applications having U.S. patent application Ser. No. 08/496,780 and U.S. patent application Ser. No. 08/496,835, filed on an even date herewith and which are assigned to the same assignee as the present application.

FIELD OF THE INVENTION

This invention relates in general to the field of frequency selection components, in particular to bulk acoustic wave frequency selection components and more particularly to a filter using improved quality factor acoustic wave frequency selection components.

BACKGROUND OF THE INVENTION

Frequency selective components are important for many electronic products requiring stable frequency signals or ability to discriminate between signals based on frequency diversity. These functions are difficult to reliably and repeatably realize in monolithic form together with other microelectronic components such as transistors, diodes and the like.

One approach to realizing frequency selective functions employs a mass allowed to vibrate in one or more dimensions (e.g., a pendulum). Such a mass is conveniently realized as a thin membrane supported at critical points, for example, peripherally or alternatively along one edge or end, forming a thin resonator structure. Such structures provide clearly defined mechanical resonances having significant utility, for example, as filters and as frequency stabilizing feedback elements in oscillator circuits. These structures have the advantages of being extremely compact and of providing narrow bandwidth (i.e., high quality factor) frequency selection components that are light weight and which do not require adjustment over the life of the component.

Thin film resonators incorporate a thin film, free-standing membrane. Typically, this is effected by forming a sacrificial layer followed by deposition of the membrane. The sacrificial layer is then selectively removed, leaving a self-supporting layer.

An alternative approach involves forming a cantilevered beam capacitively coupled to adjacent structures (e.g., a conductor placed beneath the beam). The beam is free to vibrate and has one or more resonance frequencies. Disadvantages of these approaches include need to form free-standing structures and also a tendency of the beam to "stick" to adjacent structures if or when the beam comes into contact therewith.

Problems encountered with such devices include reduced Q or quality factor due to at least two causes: (i) reduced quality factor of materials employed for the piezoelectric element and (ii) reduced quality factor for the composite resonator owing to the contributions of the metallizations forming the electrodes. Additionally, higher coupling piezoelectric materials (e.g., $LiNbO_3$, $LiTaO_3$, lithium tetraborate, $AlPO_4$, $BiGeO_{20}$, $BiSiO_{20}$ and the like) are preferred for some applications but tend to be more difficult to realize in thin film form, especially as oriented films exhibiting significant piezoelectricity.

The Q of the material(s) employed in the resonator may preclude providing the required bandwidth and insertion loss in the completed structure. Generally, narrow bandwidths require high Q materials. Deposited thin-film layers of piezoelectric materials tend to have poorer (i.e., lower) quality factors than the same materials prepared by other techniques (e.g., single-crystal materials) and this may limit the achievable bandwidth. Additionally, employing lossy materials for electrodes (e.g., Au, Ag, Pb etc.) reduces the overall Q of the resonator structure while use of low acoustic loss materials (e.g., Al and alloys thereof) has less of an adverse impact on the Q of the resonator structure. Accordingly, the bandwidth requirements for some applications may preclude use of some materials in the resonator and may require the use of other materials or particular material preparation techniques.

Many applications require robust, light-weight devices to be realized in small form factor and to consume as little electrical power as possible while operating over a broad range of temperatures. For example, satellite communications apparatus have stringent power requirements and also must operate over a broad temperature range. This example also places a premium on size, weight and reliability.

What are needed are apparatus and methods for forming apparatus wherein the apparatus provides a small, light-weight and robust resonator filter having solid mechanical support and including high quality factor, narrow-bandwidth frequency selection characteristics together with low power consumption requirements and low insertion loss.

SUMMARY OF THE INVENTION

A filter usefully comprises a first resonator coupled in shunt with a first port, a first bridging network coupled between the first port and a first node, a second resonator coupled in shunt with the first node and a second port coupled to the first node. The first and second resonators each comprise acoustic resonators and the first bridging network has an electrical length $\Theta$ at a frequency $\omega$ in a system having a characteristic admittance Y in accordance with $\omega C_o = Y\cot\Theta$, where $C_o$ is a shunt capacitance including a clamping capacitance of the first resonator and $\omega$ is a center frequency of the filter.

The first and second resonators each desirably but not essentially comprise a substrate having a surface and a resonator layer including a first electrode. The resonator layer is disposed on the surface. The first electrode is disposed on a distal surface of the resonator layer. The first and second resonators each usefully further include a cavity disposed between the substrate and the resonator layer and a second electrode disposed on the substrate and on a surface of the cavity remote from the resonator layer. The second electrode is separated from the resonator layer by a thin gap.

The first and second resonators each desirably but not essentially comprise a substrate having a surface and a resonator layer including a first electrode. The resonator layer is single-crystal lithium niobate, lithium tantalate or lithium tetraborate and is disposed on the surface. The first electrode comprises aluminum and is disposed on a distal surface of the resonator layer. A cavity is disposed between the substrate and the resonator layer. A second electrode is disposed on the substrate and on a surface of the cavity remote from the resonator layer. The second electrode comprises gold and is separated from the resonator layer by a thin gap. The first bridging network usefully has an impedance equivalent to that of a transmission line having an electrical length in accordance with $\Theta_1=\mathrm{Cos}^{-1}(\omega.C.Z_o)$, and having a characteristic impedance Z in accordance with the relation $(Z_o/Z)^2=1-(\omega.C.Z_o)^2$, where $Z_o$ is the characteristic impedance of the first port and C is a capacitance of a capacitor coupled in shunt with the first node.

The filter usefully further includes a third resonator coupled in shunt with a second node and a second bridging network coupled between the first node and the second node. The second bridging network desirably has an electrical length $\Theta_2=\mathrm{Cos}^{-1}(\omega.C.Z_o)$ at the frequency ω in a system having a characteristic impedance $Z_o$, where C includes a clamping capacitance of the first resonator.

The filter desirably further includes a third resonator coupled in shunt with a second node and a second bridging network coupled between the first node and the second node. The second bridging network desirably has an electrical length $\Theta_2=\mathrm{Cos}^{-1}(\omega.C.Z_o)$ at the frequency ω in a system having a characteristic impedance $Z_o$, where C includes a clamping capacitance of the first resonator. The filter desirably further includes a third bridging network coupled between the second node and a third node, a fourth resonator coupled in shunt with the third node, a fourth bridging network coupled between the third node and the second port and a fifth resonator coupled in shunt with the second port, wherein the third, fourth and fifth resonators also comprise acoustic resonators and the fourth bridging network has the electrical length $\Theta_1$.

The second resonator is also desirably coupled in shunt with a first capacitor and the fourth resonator is desirably coupled in shunt with a second capacitor.

A filter includes a first resonator coupled in shunt with a first port, a first bridging network coupled between the first port and a first node, a second resonator coupled in shunt with the first node, a second bridging network coupled between the first node and a second node, a third resonator coupled in shunt with the second node and a second port coupled to the first node. The first and second resonators desirably each comprise acoustic resonators and the first bridging network includes a bridging inductor having inductance L given by $L=1/\omega^2 C_o$, where $C_o$ includes a clamping capacitance of the first, second or third resonator.

The first, second and third resonators desirably but not essentially each comprise a substrate having a surface and a resonator layer including a first electrode, the resonator layer disposed on the surface. The first electrode is disposed on a distal surface of the resonator layer. The first, second and third resonators desirably but not essentially each further comprise a cavity disposed between the substrate and the resonator layer and a second electrode disposed on the substrate and on a surface of the cavity remote from the resonator layer. The second electrode is separated from the resonator layer by a thin gap.

The first, second and third resonators each usefully comprise a substrate having a surface and a resonator layer including a first electrode. The resonator layer comprises single-crystal lithium niobate, lithium tantalate or lithium tetraborate and is disposed on the surface. The first electrode comprises aluminum disposed on a distal surface of the resonator layer. The first, second and third resonators each usefully additionally comprise a cavity disposed between the substrate and the resonator layer and a second electrode disposed on the substrate and on a surface of the cavity remote from the resonator layer. The second electrode comprises gold and is separated from the resonator layer by a thin gap.

The filter desirably but not essentially further includes a third bridging network coupled between the second node and a third node, a fourth resonator coupled in shunt with the third node, a fourth bridging network coupled between the third node and the second port and a fifth resonator coupled in shunt with the second port.

The first, second, third, fourth and fifth resonators desirably but not essentially each comprise a substrate having a surface and a resonator layer including a first electrode. The resonator layer is disposed on the surface. The first electrode is disposed on a distal surface of the resonator layer. The first, second, third, fourth and fifth resonators desirably but not essentially each additionally comprise a cavity disposed between the substrate and the resonator layer and a second electrode disposed on the substrate and on a surface of the cavity remote from the resonator layer. The second electrode is separated from the resonator layer by a thin gap.

The first, second, third, fourth and fifth resonators desirably but not essentially each comprise a substrate having a surface and a resonator layer including a first electrode. The resonator layer comprises single-crystal lithium niobate, lithium tantalate or lithium tetraborate and is disposed on the surface. The first electrode comprises aluminum disposed on a distal surface of the resonator layer. The first, second, third, fourth and fifth resonators desirably but not essentially each additionally comprise a cavity disposed between the substrate and the resonator layer and a second electrode disposed on the substrate and on a surface of the cavity remote from the resonator layer. The second electrode comprises gold and is separated from the resonator layer by a thin gap.

A method for making a filter comprises steps of providing a first resonator coupled in shunt with a first port, providing a first bridging network coupled between the first port and a first node, providing a second resonator coupled in shunt with the first node, providing a second bridging network coupled between the first node and a second node, providing a third resonator coupled in shunt with the second node and providing a second port coupled to the first node. The first and second resonators each comprise acoustic resonators and the first bridging network includes a bridging inductor having inductance L given by $L=1/\omega^2 C_o$, where $C_o$ includes a clamping capacitance of the first, second or third resonator.

The steps of providing the first, second and third resonators desirably but not essentially each additionally comprise providing a substrate having a surface and providing a resonator layer including a first electrode. The resonator layer is disposed on the surface. The first electrode is disposed on a distal surface of the resonator layer. The method additionally desirably includes steps of providing a cavity disposed between the substrate and the resonator layer and providing a second electrode disposed on the substrate and on a surface of the cavity remote from the resonator layer. The second electrode is separated from the resonator layer by a thin gap.

The steps of providing the first, second and third resonators each comprise providing a substrate having a surface and providing a resonator layer including a first electrode. The resonator layer comprises single-crystal lithium niobate, lithium tantalate or lithium tetraborate and is disposed on the surface. The first electrode comprises aluminum disposed on a distal surface of the resonator layer. The method desirably further includes steps of providing a cavity disposed between the substrate and the resonator layer and providing a second electrode disposed on the substrate and on a surface of the cavity remote from the resonator layer. The second electrode comprises gold and is separated from the resonator layer by a thin gap.

The method desirably further comprises steps of providing a third bridging network coupled between the second node and a third node, providing a fourth resonator coupled in shunt with the third node, providing a fourth bridging network coupled between the third node and the second port and providing a fifth resonator coupled in shunt with the second port.

The steps of providing the first, second, third, fourth and fifth resonators usefully each comprise steps of providing a substrate having a surface and providing a resonator layer including a first electrode. The resonator layer is disposed on the surface. The first electrode is disposed on a distal surface of the resonator layer. The method usefully additionally includes steps of providing a cavity disposed between the substrate and the resonator layer and providing a second electrode disposed on the substrate and on a surface of the cavity remote from the resonator layer. The second electrode is separated from the resonator layer by a thin gap.

The steps of providing the first, second, third, fourth and fifth resonators desirably further comprises steps of providing a substrate having a surface and providing a resonator layer including a first electrode. The resonator layer comprises single-crystal lithium niobate, lithium tantalate or lithium tetraborate and is disposed on the surface. The first electrode comprises aluminum disposed on a distal surface of the resonator layer. The steps of providing the first, second, third, fourth and fifth resonators desirably further comprises steps of providing a cavity disposed between the substrate and the resonator layer and providing a second electrode disposed on the substrate and on a surface of the cavity remote from the resonator layer. The second electrode comprises gold and is separated from the resonator layer by a thin gap.

DETAILED DESCRIPTION OF THE DRAWINGS

Resonators in accordance with the present invention may be formed in several types of structures. These include a via hole structure and a cavity structure. Both structures include placing a resonant structure on a surface of a substrate.

I. Via Hole Structure

Figure 1:
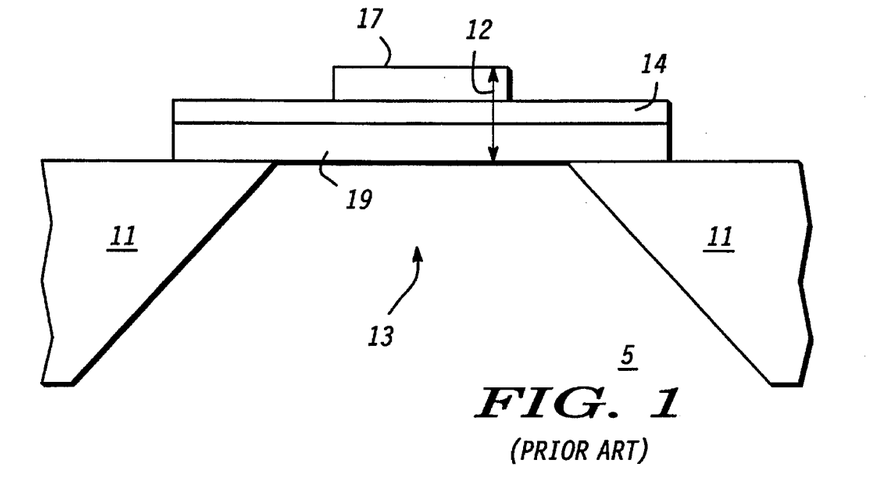
FIG. 1 illustrates a simplified side view, in section, of a thin-film acoustic resonator in accordance with the prior art.

FIG. 1 illustrates a simplified side view, in section, of acoustic resonator 5 comprising substrate 11 and piezoelectric resonator layer 14 having electrodes 17 and 19, conductor 215 (see FIG. 4 and accompanying text, infra), and thickness 12 in accordance with the prior art. Thickness 12 is typically chosen to be one-half of an acoustic wavelength or an odd multiple thereof. A portion of resonator layer 14 disposed over via or cavity 13 and beneath electrode 17 provides mechanical oscillations that determine the frequency response of resonator 5.

Substrate 11 provides mechanical support for piezoelectric resonator layer 14 and electrodes 17 and 19 and for any ancillary components such as transistors, diodes, capacitors, resistors and the like included as part of a larger microelectronic device or integrated circuit (not shown). Substrate 11 conveniently comprises semiconductor material(s) or is compatible therewith (e.g., silicon on sapphire, cadmium sulphide on glass etc.). Semiconductor materials presently of particular interest include elemental semiconductors such as diamond, silicon, germanium and silicon carbide, III–V materials such as gallium arsenide, aluminum nitride, indium phosphide and the like, II–VI materials such as cadmium sulphide, zinc oxide and so forth and alloys such as, by way of example and not intended to be limiting, $Si_xGe_{1-x}$, $Al_xGa_{1-x}As$ and $In_xAl_{1-x}P$. Cubic semiconductors (e.g., Si, Ge, GaAs etc.) are often prepared as wafers having a [100] surface, for example, which surface is polished and otherwise prepared for use as semiconductor device substrates. Other useful orientations include [110] and [111] faces.

An acoustic resonator such as 5 of FIG. 1 including substrate material 11 having layers 14, 17, 19 disposed thereon is etched from the back side to provide an opening 13 extending up to the bottom of the membrane comprising layers 14, 17, 19. This can be accomplished by use of etchants having etch rates sensitive to doping of semiconductor materials 11 coupled with use of a surface layer of material having different doping than the bulk of the material, for example. Other options include employing a surface layer or layers (e.g., layers 14, 17, 19) of different composition and/or crystallographic form or orientation to provide a layer following etching or other treatment to selectively remove some of material 11 immediately therebelow.

Problems encountered with this structure in some applications include or stem from (i) limitations on the availability of high Q materials in thin film form, (ii) limitations on the Q of the resonator structure due to the metallization (i.e., layers 17, 19) and (iii) limitations on the coupling coefficient of the piezoelectric materials that this structure requires.

II. Cavity Structure

Figure 2:
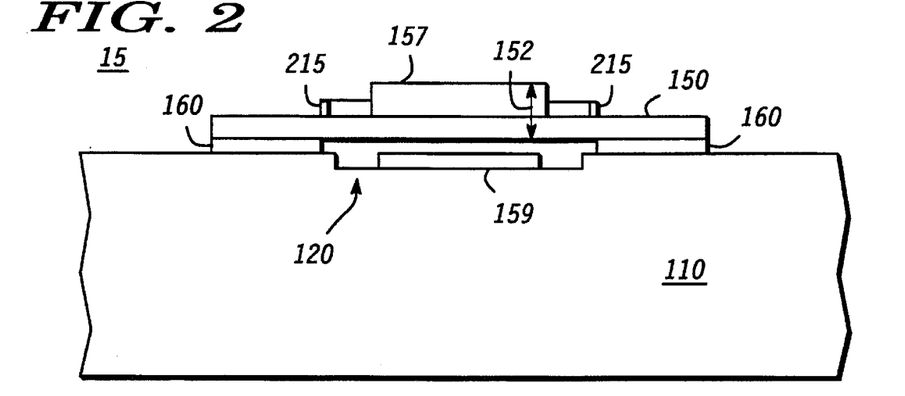
FIG. 2 illustrates a simplified side view, in section, of a first embodiment of a resonator in accordance with the present invention.

FIG. 2 illustrates a simplified side view, in section, of a first embodiment of high quality factor resonator structure 15 wherein resonator layer 150 is supported above cavity 120 in the surface of substrate 110 by thin layer of material 160. Cavity 120 also includes electrode 159 below, but not in physical contact with, resonator layer 150.

Figure 3:
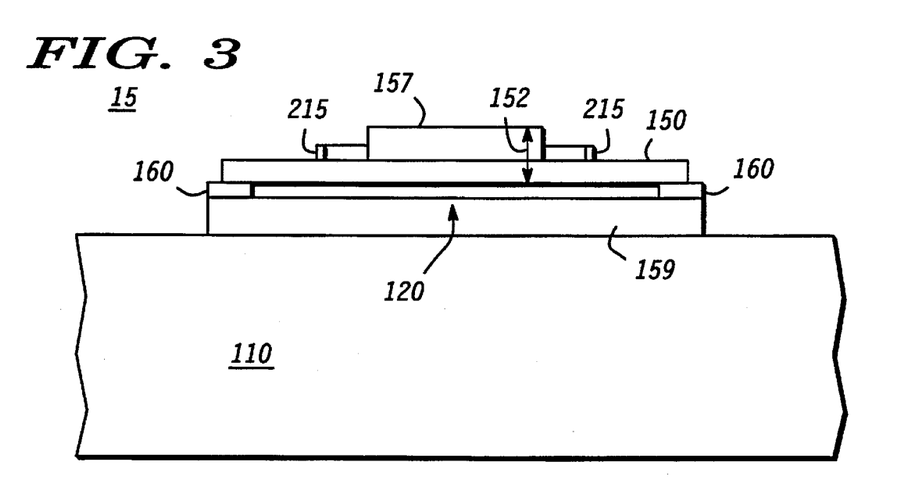
FIG. 3 illustrates a simplified side view, in section, of a second embodiment of a resonator in accordance with the present invention.

FIG. 3 illustrates a simplified side view, in section, of a second embodiment of high quality factor resonator structure 15 wherein resonator layer 150 is supported above a cavity 120 disposed above the surface of substrate 110 by a thin layer of material 160. In this case, cavity 120 is formed exclusively by layer 160.

FIGS. 2 and 3 further illustrate conductor 215 comprising a resistive loop (having interconnections 216, 216', not shown in FIGS. 2, 3). Conductor 215 is heated by current (e.g., DC) introduced via interconnections 216, 216' (see FIG. 4 and §III, infra) to maintain resonator layer 150 at a desired predetermined temperature. Generally, this is done in order to reduce or avoid thermally-induced drift of the frequency response of resonator 15. Interconnections 216, 216' and transmission line 210 are routed to provide appropriate electrical connections to each, for example, by including an airbridge or other type of crossover or by making conductor 215 in the shape of a reentrant loop (not illustrated). Structure 215 is shown in each of FIGS. 2–4 and is discussed further in conjunction with the discussion of FIG. 4 in §III, infra.

In the structures depicted in FIGS. 2, 3, the gap separating electrode 159 from resonator layer 150 is desirably small, on the order of one-tenth or less of the thickness of resonator layer 150, but may be larger in some applications. Resonator layer 150 usefully has a thickness in a range of from less than a micrometer up to about a millimeter, desirably in a range of from less than a micrometer up to about ten micrometers and preferably in a range of from about one-half of a micrometer to about five micrometers. Thicknesses as discussed herein are measured along an axis as indicated by arrow 152. Arrow 152 also denotes the thickness of the combination of top electrode 157 and resonator layer 150. Substrate 110 is usefully a semiconductor substrate and desirably includes integrated circuitry.

Two elements of high quality factor resonator structure 15 increase the quality factor above that obtainable by prior art techniques: (i) utilizing single-crystal material for resonator layer 150 and (ii) separating resonator layer 150 from bottom electrode 159 by the small gap therebetween. In the embodiment illustrated in FIG. 3, this thickness is equal to the thickness of thin layer of material 160. The single-crystal material employed for resonator layer 150 desirably but not essentially comprises a dielectric material having a large relative permittivity ($\epsilon_r$) and also desirably comprises a piezoelectric material (e.g., $LiNbO_3$, $LiTaO_3$, lithium tetraborate and the like). The second element avoids viscous losses encountered in thin metal films at the frequencies of interest when the metal films are insonified by the resonator structure 15. Because bottom electrode 159 is not in physical contact with resonator layer 150, bottom electrode 159 may comprise materials (e.g., gold, silver etc.) that ordinarily would not be suitable for use as an electrode for exciting mechanical oscillation and/or resonance in resonator layer 150. Top electrode 157 is disposed on a distal surface of resonator layer 150, i.e., remote from substrate 110, and desirably comprises a thin (e.g., in the range of from 0.05 micrometers to several micrometers) layer of aluminum to reduce acoustic losses and mass loading effects. Typically, thinner films are employed for top electrode 157 when thinner resonator layers 150 are employed in resonator 15.

A variety of techniques applicable to acoustic resonator structures 5, 15 of FIGS. 1–4 are described in U.S. Pat. No. 4,556,812, G. R. Kline et al., "Acoustic Resonator with Al Electrodes on an AlN Layer and Using a GaAs Substrate" (Dec. 3, 1985); U.S. Pat. No. 3,313,959, J. G. Dill, "Thin-Film Resonance Device" (Apr. 11, 1967); U.S. Pat. No. 4,456,850, T. Inoue et al., "Piezoelectric Composite Thin Film Resonator" (Jun. 26, 1984); U.S. Pat. No. 4,502,932, G. R. Kline et al., "Acoustic Resonator and Method of Making Same" (Mar. 5, 1985); U.S. Pat. No. 4,460,756, J. S. Wang et al., "Method of Making a Piezoelectric Shear Wave Resonator" (Feb. 3, 1987); U.S. Pat. No. 4,642,508, H. Suzuki et al., "Piezoelectric Resonating Device" (Feb. 10, 1987); U.S. Pat. No. 4,719,383, J. S. Wang et al., "Piezoelectric Shear Wave Resonator and Method of Making Same" (Jan. 12, 1988); U.S. Pat. No. 5,011,568, S. D. Brayman et al., "Use of Sol-Gel Derived Tantalum Oxide as a Protective Coating for Etching Silicon" (Apr. 30, 1991); U.S. Pat. No. 5,075,641, R. J. Weber et al., "High Frequency Oscillator Comprising Thin Film Resonator and Active Device" (Dec. 24, 1991); U.S. Pat. No. 5,162,691, E. A. Mariani et al., "Cantilevered Air-Gap Type Thin Film Piezoelectric Resonator" (Nov. 10, 1992); and U.S. Pat. No. 5,373,268, L. N. Dworsky et al., "Thin Film Resonator Having Stacked Acoustic Reflecting Impedance Matching Layers and Method" (Dec. 13, 1994), which patents are hereby incorporated herein by reference.

III. Heating Element

Figure 4:
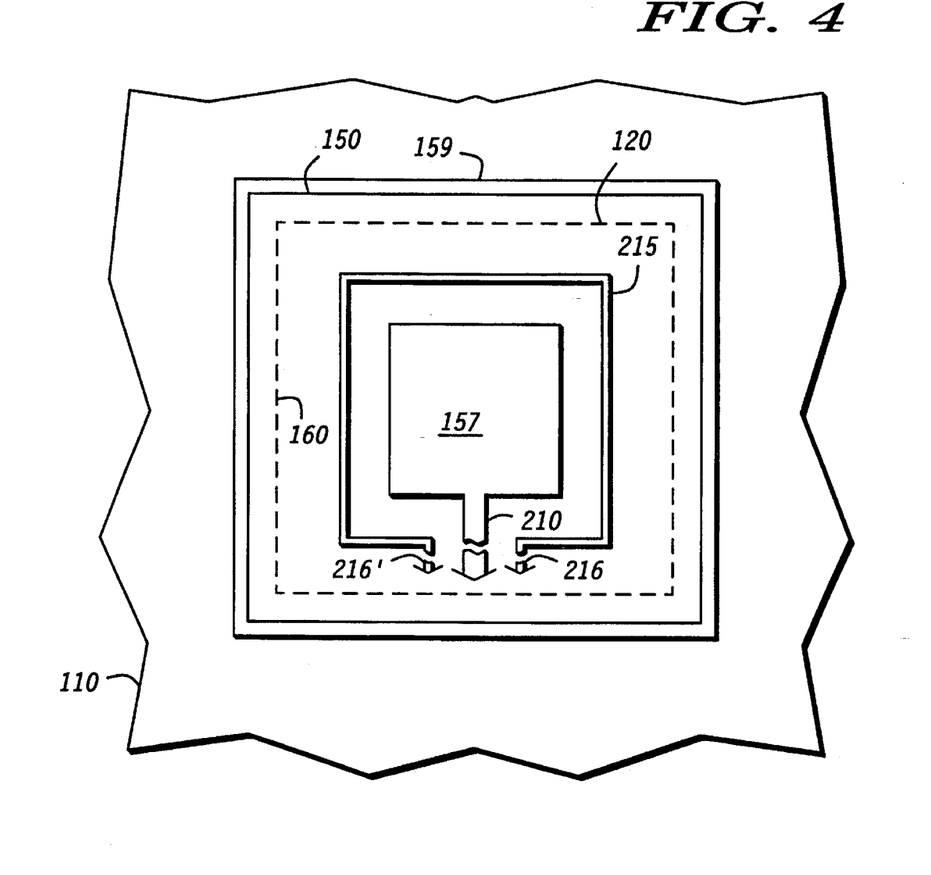
FIG. 4 illustrates a simplified plan view of a first embodiment of a temperature compensated resonator in accordance with the present invention.

FIG. 4 illustrates a simplified plan view of temperature compensated resonator 15 in accordance with the present invention. Temperature compensated resonator 15 includes electrode 157 disposed on a portion of resonator layer 150 having a periphery that is within the boundaries of via 120, shown in dotted outline in FIG. 4. Electrode 159 is illustrated as covering the entire bottom of resonator layer 150 but need only extend to cover that portion of resonator layer 150 intended to contribute to mechanical oscillation of temperature compensated acoustic resonator 15. In the example illustrated in FIG. 4, electrode 159 is also employed to mechanically affix resonator layer 150 to substrate 110 through a process, for example, of resistive heating (§IV, infra) or thermosonic bonding (§V, infra).

FIG. 4 also illustrates transmission line 210 having electrical connection to electrode 157 and extending from electrode 157 to external electrical circuitry (not illustrated). Transmission line 210 is constructed to have a particular characteristic impedance by varying the width of transmission line 210 and taking into account the thickness and the relative dielectric constant of resonator layer 150 and related structures in accordance with principles well known in the electromagnetic arts.

FIG. 4 further illustrates conductor 215 comprising a resistive loop having interconnections 216, 216'. Conductor 215 is heated by current (e.g., DC) introduced via interconnections 216, 216' to maintain resonator layer 150 at a desired predetermined temperature. Generally, this is done in order to reduce or avoid thermally-induced drift of the frequency response of resonator 15. Interconnections 216, 216' and transmission line 210 are routed to provide appropriate electrical connections to each, for example, by including an airbridge or other type of crossover or by making conductor 215 in the shape of a reentrant loop (not illustrated in FIG. 4).

It will be appreciated that the structures of conductor 215 illustrated in FIG. 4 may be realized by disposing the material comprising conductor 215 in other geometric shapes, e.g., in a substantially hexagonal or octagonal shape, or as a circle or the like. Similarly, the shapes of electrodes 159, 157 need not comprise squares as illustrated but may also be other polygonal or curvilinear shapes. Moreover, the shape adopted for electrode(s) 157 and/or 159 need not be the same as that of conductor 215, e.g., a square shape may be adopted for electrode 157 while a circular shape may be adopted for conductor 215. Conductor 215 is desirably formed of a material such as TiW, NiCr, Cr etc. having a thickness and linewidth to provide a desired resistance in accordance with a typical prime power requirement of 100 milliwatts in order to maintain a temperature of 100° C. In the preferred embodiment, electrodes 159, 157 and conductor 215 desirably form circular shapes because these shapes reduce undesirable temperature gradients within the composite resonator structure.

IV. Resistance Welding Attachment

Attachment of resonator layer 150, especially resonator layers 150 comprising single-crystal materials such as LiNbO$_3$, LiTaO$_3$ and the like, may be effectuated via resistance welding, as described in "Fabrication of Wideband Bragg Cells Using Thermocompression Bonding and Ion Beam Milling", J. Rosenbaum et al., IEEE Trans. Son. Ultrason., Vol. SU-32, No. 1, January 1985, which article is hereby incorporated herein by reference. This article describes attachment and subsequent thinning of single-crystal, high coupling coefficient materials. The two surfaces to be bonded are metallized by vacuum evaporation to include 0.1 to 0.5 micrometers of metal, preferably silver or gold. A pressure of 2000 to 7000 lbf/in$^2$ (140 to 500 kg/cm$^2$) is applied, and a resistance check provides positive identification of samples lacking intimate contact between the two surfaces to be joined. A single current pulse (e.g., having an amplitude of tens of amperes and a duration in a range of several tens of milliseconds) is applied to heat bonding film 160 to 200° to 400° C. The specific current and duration of the pulse are chosen in accordance with the thermal properties of the materials to be joined and thermal design principles.

Following attachment, the single-crystal piezoelectric material (e.g., resonator layer 150) is mechanically lapped to a thickness of about 25 micrometers and is subsequently ion milled to a thickness in a range of one to three micrometers. Greater thicknesses may be employed for lower frequency devices.

V. Ultrasonic Welding Attachment

Attachment of single-crystal materials by ultrasonic welding is described in "Performance of Single-Crystal LiNbO$_3$ Transducers Operating Above 1 GHz", by N. Uchida et al., IEEE Trans. Son. Ultrason., Vol. SU-20, No. 3, July 1973 or "Ultrasonically Welded Piezoelectric Transducers", by J. D. Larson III et al., IEEE Trans. Son. Ultrason. Vol. SU-18, No. 3, July 1971, which articles are incorporated herein by reference. These articles describe mounting of single-crystal materials having thicknesses in a range of more than one millimeter to about one hundred micrometers (with subsequent mechanical polishing to reduce the thickness to about six to ten micrometers) using pressures in a range of from 2000 to 4000 lb/in$^2$ (140 to 280 kg/cm$^2$), acoustic powers of less than a watt (18 kHz), temperatures in a range of from 250° to 400° C. and times of from 15 to 120 minutes (Larson et al.) or pressures in a range of 120 kg/cm$^2$, a few watts of ultrasonic energy (15 kHz), temperatures of about 300° C. and a time of about 90 minutes (Uchida et al.).

Subsequent thinning of the mounted resonator may be effected by sputtering as described by Uchida et al. or Larson et al.

VI. Example I

An example of a resonator design is summarized below and compared to a conventional design in Table I. The new design has about one-half the motional capacitance but about three-fourths the static capacitance of a conventional design, about one-third more resonance equivalent capacitance, slightly less than twice the radiation resistance and about twice the motional inductance of the conventional design. These values suggest that different impedance inverter circuitry may be required in order to employ the new design to greatest advantage.

TABLE I

Modeled characteristics of LiNbO$_3$ resonators having an area of 4.5 × 10–8 m$^2$, Cs = 3.969 pF, where the new design incorporates an air gap of 0.1 micrometer between one electrode and the crystalline resonator layer.

|  | $C_m$ 10–3 mF | $L_m$ nH | $R_m$ Ω | $C_o$ pF | Cr pF |
|---|---|---|---|---|---|
| Conventional | 8.88 | 1099 | 0.356 | 1.365 | 152.7 |
| New Design | 4.925 | 1978 | 0.6408 | 1.0107 | 204.8 |

VII. Example II

A series of calculations were made of $C_o$ (static capacitance, given in Pf), $C_m$ (motional capacitance in 10$^{-3}$ pF), $R_m$ (motional resistance), $L_m$ (motional inductance in nanohenrys), fs (zero frequency in gigahertz), fp (pole frequency in gigahertz), Qu (unloaded Q) and Cr (capacitance ratio) for LiNbO$_3$ resonators having a thickness d of circa 11.45 micrometers (operating at the N=5$^{TH}$ harmonic) and an area (of electrode 157) of 4.5.10$^{-8}$ m$^2$ for different configurations. These values are summarized in Table II below.

TABLE II

Representative values for five different resonator configurations illustrating effect of number of electrodes and choice of electrode material on impedance characteristics. 1 = no electrodes; 2 = 0.2 µm Al electrodes each side; 3 = 0.1 µm Al electrodes each side; 4 = 0.1 µm Al on one side, 0.1 µm Au on the other; 5 = 0.1 µm Al electrodes on both sides; 1–4, d = 1.45 micrometers; 5, d = 11.3 micrometers.

|  | 1 | 2 | 3 | 4 | 5 |
|---|---|---|---|---|---|
| $C_o$ | 1.356 | 1.356 | 1.356 | 1.356 | 1.3789 |
| $C_m$ | 8.88 | 8.75 | 8.87 | 7.93 | 8.99 |
| $R_m$ | 0.356 | 0.537 | 0.443 | 2.1785 | 0.438 |
| $L_m$ | 1099 | 1163 | 1123 | 1332 | 1080 |
| fs | 1.6104 | 1.57704 | 1.59355 | 1.54843 | 1.61448 |
| fp | 1.6157 | 1.58213 | 1.59877 | 1.55295 | 1.61977 |
| Qu | 31237 | 21453 | 25417 | 5951 | 25008 |
| Cr | 153 | 155 | 153 | 171 | 153 |

The results summarized in Table II show that the unloaded Q is grossly reduced by use of a gold electrode (example 4) and that adding any metal reduces the unloaded Q (compare example 1 to the others). The gold electrode also shows the greatest reduction in frequency, due to mass loading of the resonator.

VIII. Filter

Figure 5:
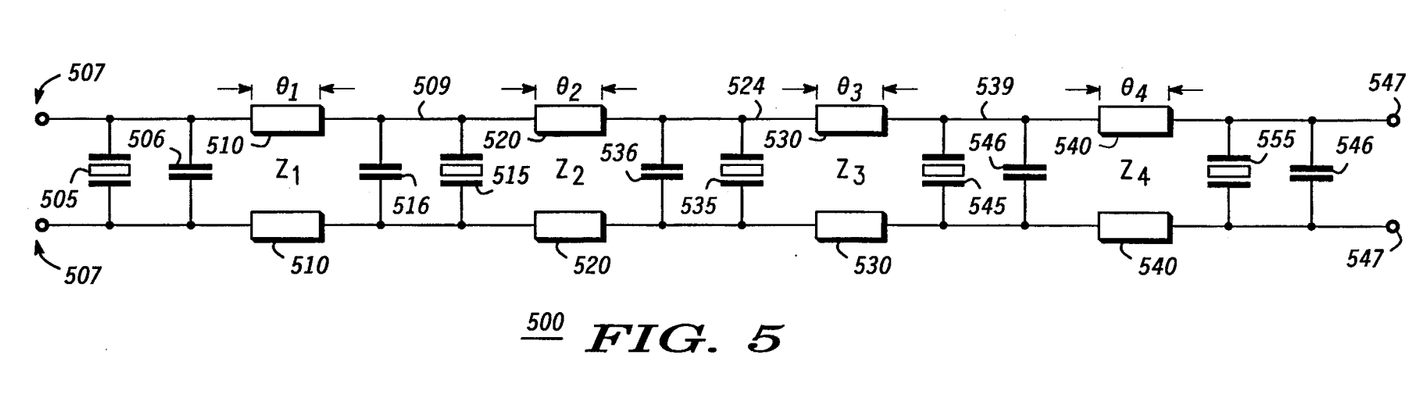
FIG. 5 is a schematic diagram illustrating a five pole band reject filter that usefully employs the resonator depicted in FIGS. 1–4.

FIG. 5 is a schematic diagram illustrating five pole band reject filter 500 that usefully employs resonator 5, 15 depicted in FIGS. 1–4. It will be appreciated by those of skill in the relevant arts that other filter configurations also usefully employ resonators such as resonator 5, 15 (e.g., bandpass, lattice etc.) and that band reject filter 500 has been chosen for purposes of illustration. Band reject filter 500 includes resonator 505 and optional capacitor 506 in shunt with first port 507, transmission line 510 having characteristic impedance $Z_1$ and electrical length $\Theta_1$ coupled between first port 507 and first node 509, resonator 515 and optional capacitor 516 coupled in shunt with node 509, transmission line 520 having characteristic impedance $Z_2$ and electrical length $\Theta_2$ coupled between first node 509 and second node 529, resonator 535 coupled and optional capacitor 536 coupled in shunt with second node 529, transmission line 530 having characteristic impedance $Z_3$ and electrical length $\Theta_3$ coupled between second node 529 and third node 539, resonator 545 and optional capacitor 546 coupled in shunt with third node 539, transmission line 540 having characteristic impedance $Z_4$ and electrical length $\Theta_4$ coupled between third node 539 and second port 547 and resonator 555 and optional capacitor 556 coupled in shunt with port 547. In applications where it is desired for first and second ports 507, 547 to have the same impedance, odd numbers of resonators 505, 515, 525, 535, 545, 555 are preferred because this arrangement obviates need for impedance transformation circuitry.

To meet the requirements summarized below in Table III, it is necessary that components comprising filter 500 have high Q, especially resonators 505, 515, 525, 535, 545, 555.

TABLE III

Sample filter specifications.

| | |
|---|---|
| Pass Band | 1616.0–1626.5 MHz |
| Reject Band | 1610.6–1613.8 MHz |
| Return Loss | $\geq$18 dB |
| Insertion Loss | $\leq$0.5 dB |
| Minimum Rejection | 20 dB |
| Temperature Range | –40 to +50° C. |
| Power handling capacity | 10 Watts (peak) |

Meeting these requirements together with demands for small size and low weight suggest that resonators 505–555 comprise acoustic resonators because the velocity of sound is some five orders of magnitude lower than electromagnetic signal speeds, implying a substantial reduction in size and weight. The requirements summarized in Table III suggest that an unloaded Q (Qu) on the order of 18,000 is needed for each of resonators 505–555 to provide the desired performance. In turn, the size constraints together with the Q requirements dictate use of single-crystal materials for acoustic resonators 505–555. The frequencies needed give thicknesses d for resonators 505–555 according to:

$$d = v_a \cdot N/(2f), \tag{1}$$

where f stands for frequency, or about 2.3 micrometers for N=1 if LiNbO$_3$ (acoustic velocity $v_a$=7,400 m/s) is employed for the resonator. For N=5, thicknesses d of about 11.5 micrometers are appropriate, but the clamping capacitance $C_o$ is related to the motional capacitance $C_m$ and the coupling coefficient k by:

$$C_o/C_m = (\tfrac{1}{8})(\pi \cdot N/k)^2. \tag{2}$$

The value for the motional capacitance is found from:

$$\omega \cdot C_m = g_i \cdot g_{n+1}(\omega_2 - \omega_1) Y_o/\omega_o, \tag{3}$$

where $g_i$ and $g_{n+1}$ are low pass prototype elements.

Figure 6:
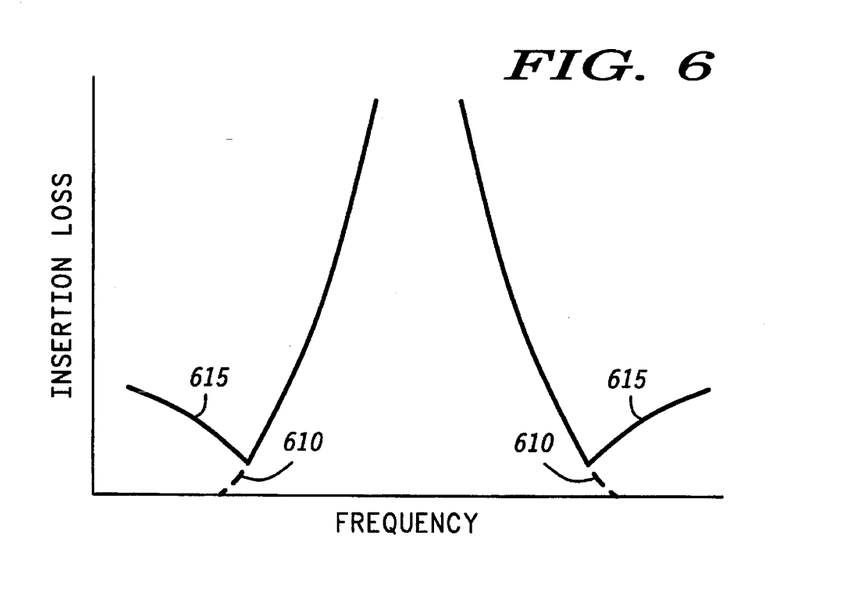
FIG. 6 is a graph of insertion loss versus frequency for filters of the type illustrated in FIG. 5.

FIG. 6 is a simplified and idealized graph of insertion loss versus frequency for filters of the type illustrated in FIG. 5. Dashed curve 610 illustrates an idealized filter response while solid curve 615 demonstrates the effect of failing to account for the clamping capacitance or to absorb the clamping capacitance in the impedance inverters (e.g., transmission lines 510, 520, 530, 540, FIG. 5). This is conveniently realized in either of two ways: (A) by simulating transmission lines 510, 520, 530, 540 as $\pi$ networks employing capacitors shunted to ground and including a bridging inductor, or (B) as two capacitors that are separated by a length of transmission line. Choosing the harmonic for operating the resonators allows tailoring of the clamping capacitance to promote inclusion of the clamping capacitance in the impedance inversion circuitry.

An optimal harmonic for operation of resonators 505–555, given as the nearest odd integer, is found from:

$$N^2 = 8 \cdot \omega_0 \cdot (k/\pi)^2/(g_o \cdot g_i \cdot (\omega_2 - \omega_1)), \tag{4}$$

where $\omega_2$, $\omega_1$ are frequencies defining the passband bandwidth. This gives a value of N=5 for the parameters summarized in Table III, with the result that additional capacitance (i.e., optional capacitors 506, 516, 526, 536, 546, 556) is required in order to realize the circuit of FIG. 5.

A. Pi Network Realization

A $\pi$ network realization has the advantages of simplicity, ease of design and ready realization in monolithic form together with compactness and robustness. A $\pi$ network realization is one including resonators in shunt to ground as the "legs" of the $\pi$ network and a bridging inductor to complete the $\pi$ network. One way of modeling a $\pi$ network is as an equivalent circuit to a one-fourth wavelength long section of transmission line having characteristic impedance $Z_x$ (i.e., characteristic admittance $Y_x = 1/Z_x$) and selecting C (the capacitance of each leg) to satisfy:

$$\omega C = Y_x. \tag{5}$$

The inductance L for the bridging inductor satisfies:

$$\omega L = Z_x. \tag{6}$$

Eqs. 5, 6 provide values for a lumped-element equivalent circuit for the transmission line impedance inverter.

A filter design for the filter schematically shown in FIG. 5 and meeting the performance characteristics shown in Table III has sections 1 and 4 identical to each other and similarly sections 2 and 3 are identical to each other. Capacitors 516–546 are conveniently realized as MIM capacitors having Q=1000 (516, 556=0.36 pF; 516, 546= 2.07 pF; 536=1.154 pF) while resonators 505 (555), 515 (545), 535 are realized as resonators having areas of 8.89$^2$ mils$^2$, 9.82 mils$^2$ and 11.852 mils$^2$, respectively. Inductors replacing transmission lines 510 (540) and 520 (530) are realized as having a Q of 50.

B. Transmission Line Realization

The latter approach has an additional degree of freedom permitting the elimination of all but one MIM capacitor in a filter design using bulk acoustic wave resonators. The latter design is completed by (i) choosing the inverter capacitance to be the clamping capacitance and (ii) solving for the electrical length ($\Theta$) and the characteristic impedance (Z) of the new transmission line. This is usefully done by comparing the odd- and even-mode structures to those of an inverter circuit consisting of a transmission line having an electrical length (2$\phi$) of ninety degrees and a characteristic impedance $Z_o$ (=1/Y). The result is:

$$\cos \Theta = \omega C \cdot Z_o \tag{7}$$

and $$Z/Z_o = (1-(\omega.C.Z_o))^{-0.5}. \quad (8)$$

In order to reduce the physical length of the new inverter, it is desirable to increase the characteristic impedance of the transmission line and to include a loading capacitor having capacitance C. The new characteristic impedance Z and electrical length Θ are in accordance with:

$$(Z_o/Z)^2 = 1-(\omega.C.Z_o)/(\sin(2\phi)) \quad (9)$$

for the characteristic impedance and:

$$\tan\Theta = (1-(\omega.C.Z_o))^{1/2}.\tan\phi \quad (10)$$

for the new electrical length, where C is the shunt capacitance loading the new transmission line (i.e., is or includes the resonator clamping capacitance $C_o$), the old characteristic impedance is denoted $Z_o$ and the old electrical length is denoted φ.

IX. Conclusion

Thus, a filter employing high Q resonator 15 has been described which overcomes specific problems and accomplishes certain advantages relative to prior art methods and mechanisms. The improvements over known technology are significant. The expense, complexities and high weight, size and power requirements of prior art approaches are avoided. Resonator 15 having a thin gap between resonator layer 150 and second electrode 159 may be usefully combined to form filters and oscillators that are manufacturable and are robust in operation, and may be combined with monolithic integrated circuitry to provide signal processing modules that are extremely compact.

Moreover, in alternative embodiments (not illustrated), conductor 215 (FIG. 4) may be formed on substrate 110 or may comprise a suitably-doped and shaped region within substrate 110. These embodiments are not as efficient in heating resonator layer 150 but have the advantage of requiring less lithography to be performed on resonator layer 150. Alternatively, conductor 215 may be configured as a single strip along one or more sides of electrode 157. This arrangement simplifies layout etc. but also introduces undesirable temperature gradients within resonator layer 150.

It will be appreciated that either of the welding techniques described may be employed with either of the gas-phase etching processes described for thinning resonator layer 150 or that other bonding or thinning processes may be usefully applied for manufacturing acoustic resonator 15.

The foregoing description of the specific embodiments will so fully reveal the general nature of the invention that others can, by applying current knowledge, readily modify and/or adapt for various applications such specific embodiments without It is to be understood that the phraseology or terminology employed herein is for the purpose of description and not of limitation. Accordingly, the invention is intended to embrace all such alternatives, modifications, equivalents and variations as fall departing from the generic concept, and therefore such adaptations and modifications should and are intended to be comprehended within the meaning and range of equivalents of the disclosed embodiments.

I claim:

1. A filter using an enhanced quality factor resonator, said filter comprising:

a first resonator coupled in shunt with a first port;

a first bridging network coupled between said first port and a first node;

a second resonator coupled in shunt with said first node; and a second port coupled to said first node, wherein said first and second resonators each comprise acoustic resonators and said first bridging network has an electrical length Θ at a frequency ω in a system having a characteristic admittance Y in accordance with $\omega C_o = Y\cot\Theta$, where $C_o$ is a shunt capacitance including a clamping capacitance of said first resonator and ω is a center frequency of said filter.

2. A filter as claimed in claim 1, wherein said first and second resonators each comprise:

a substrate having a surface;

a resonator layer including a first electrode, said resonator layer disposed on said surface, said first electrode disposed on a surface of said resonator layer;

a cavity disposed between said substrate and said resonator layer; and a second electrode disposed on said substrate and on a surface of said cavity remote from said resonator layer, wherein said second electrode is separated from said resonator layer by a thin gap.

3. A filter as claimed in claim 1, wherein said first and second resonators each comprise:

a substrate having a surface;

a resonator layer including a first electrode, said resonator layer comprising single-crystal lithium niobate, lithium tantalate or lithium tetraborate and disposed on said surface, said first electrode comprising aluminum and disposed on a surface of said resonator layer;

a cavity disposed between said substrate and said resonator layer; and a second electrode disposed on said substrate and on a surface of said cavity remote from said resonator layer, wherein said second electrode comprises gold and is separated from said resonator layer by a thin gap.

4. A filter as claimed in claim 1, wherein said first bridging network has an impedance equivalent to that of a transmission line having an electrical length in accordance with $\Theta_1 = \cos^{-1}(\omega.C.Z_o)$, and having a characteristic impedance Z in accordance with the relation $(Z_o/Z)^2 = 1-(\omega.C.Z_o)^2$, where $Z_o$ is the characteristic impedance of said first port and C is a capacitance of a capacitor coupled in shunt with said first node.

5. A filter as claimed in claim 1, further comprising:

a third resonator coupled in shunt with a second node; and a second bridging network coupled between said first node and said second node, wherein said second bridging network has an electrical length $\Theta_2 = \cos^{-1}(\omega.C.Z_o)$ at said frequency ω in a system having a characteristic impedance $Z_o$, where C includes a clamping capacitance of said first resonator.

6. A filter as claimed in claim 4, further comprising:

a third resonator coupled in shunt with a second node;

a second bridging network coupled between said first node and said second node, wherein said second bridging network has an electrical length $\Theta_2 = \cos^{-1}(\omega.C.Z_o)$ at said frequency ω in a system having a characteristic impedance $Z_o$, where C includes a clamping capacitance of said first resonator;

a third bridging network coupled between said second node and a third node;

a fourth resonator coupled in shunt with said third node;

a fourth bridging network coupled between said third node and said second port; and a fifth resonator coupled in shunt with said second port, wherein said third, fourth and fifth resonators also comprise acoustic resonators and said fourth bridging network has an electrical length $\Theta_4$.

7. A filter as claimed in claim 6, wherein said second resonator is also coupled in shunt with a first capacitor and said fourth resonator is coupled in shunt with a second capacitor.

8. A filter comprising:

a first resonator coupled in shunt with a first port;

a first bridging network coupled between said first port and a first node;

a second resonator coupled in shunt with said first node;

a second bridging network coupled between said first node and a second node;

a third resonator coupled in shunt with said second node; and a second port coupled to said first node, wherein said first and second resonators each comprise acoustic resonators and said first bridging network includes a bridging inductor having inductance L given by $L=1/\omega^2 C_o$, where $C_o$ includes a clamping capacitance of said first, second or third resonator.

9. A filter as claimed in claim 8, wherein said first, second and third resonators each comprise:

a substrate having a surface;

a resonator layer including a first electrode, said resonator layer disposed on said surface, said first electrode disposed on a surface of said resonator layer;

a cavity disposed between said substrate and said resonator layer; and a second electrode disposed on said substrate and on a surface of said cavity remote from said resonator layer, wherein said second electrode is separated from said resonator layer by a thin gap.

10. A filter as claimed in claim 8, wherein said first, second and third resonators each comprise:

a substrate having a surface;

a resonator layer including a first electrode, said resonator layer comprising single-crystal lithium niobate, lithium tantalate or lithium tetraborate and disposed on said surface, said first electrode comprising aluminum and disposed on a surface of said resonator layer;

a cavity disposed between said substrate and said resonator layer; and a second electrode disposed on said substrate and on a surface of said cavity remote from said resonator layer, wherein said second electrode comprises gold and is separated from said resonator layer by a thin gap.

11. A filter as claimed in claim 8, further comprising:

a third bridging network coupled between said second node and a third node;

a fourth resonator coupled in shunt with said third node;

a fourth bridging network coupled between said third node and said second port; and a fifth resonator coupled in shunt with said second port.

12. A filter as claimed in claim 11, wherein said first, second, third, fourth and fifth resonators each comprise:

a substrate having a surface;

a resonator layer including a first electrode, said resonator layer disposed on said surface, said first electrode disposed on a surface of said resonator layer;

a cavity disposed between said substrate and said resonator layer; and a second electrode disposed on said substrate and on a surface of said cavity remote from said resonator layer, wherein said second electrode is separated from said resonator layer by a thin gap.

13. A filter as claimed in claim 11, wherein said first, second, third, fourth and fifth resonators each comprise:

a substrate having a surface;

a resonator layer including a first electrode, said resonator layer comprising single-crystal lithium niobate, lithium tantalate or lithium tetraborate and disposed on said surface, said first electrode comprising aluminum and disposed on a surface of said resonator layer;

a cavity disposed between said substrate and said resonator layer; and a second electrode disposed on said substrate and on a surface of said cavity remote from said resonator layer, wherein said second electrode comprises gold and is separated from said resonator layer by a thin gap.

14. A method for making a filter comprises steps of:

providing a first resonator coupled in shunt with a first port;

providing a first bridging network coupled between said first port and a first node;

providing a second resonator coupled in shunt with said first node;

providing a second bridging network coupled between said first node and a second node;

providing a third resonator coupled in shunt with said second node; and providing a second port coupled to said first node, wherein said first and second resonators each comprise acoustic resonators and said first bridging network includes a bridging inductor having inductance L given by $L=1/\omega^2 C_o$, where $C_o$ includes a clamping capacitance of said first, second or third resonator.

15. A method as claimed in claim 14, wherein said steps of providing said first, second and third resonators each comprise:

providing a substrate having a surface;

providing a resonator layer including a first electrode, said resonator layer disposed on said surface, said first electrode disposed on a surface of said resonator layer;

providing a cavity disposed between said substrate and said resonator layer; and providing a second electrode disposed on said substrate and on a surface of said cavity remote from said resonator layer, wherein said second electrode is separated from said resonator layer by a thin gap.

16. A method as claimed in claim 14, wherein said steps of providing said first, second and third resonators each comprise:

providing a substrate having a surface;

providing a resonator layer including a first electrode, said resonator layer comprising single-crystal lithium niobate, lithium tantalate or lithium tetraborate and disposed on said surface, said first electrode comprising aluminum and disposed on a surface of said resonator layer;

providing a cavity disposed between said substrate and said resonator layer; and providing a second electrode disposed on said substrate and on a surface of said cavity remote from said resonator layer, wherein said second electrode comprises gold and is separated from said resonator layer by a thin gap.

17. A method as claimed in claim 14, further comprising steps of:

providing a third bridging network coupled between said second node and a third node;

providing a fourth resonator coupled in shunt with said third node;

providing a fourth bridging network coupled between said third node and said second port; and providing a fifth resonator coupled in shunt with said second port.

18. A method as claimed in claim 17, wherein said steps of providing said first, second, third, fourth and fifth resonators each comprise steps of:

providing a substrate having a surface;

providing a resonator layer including a first electrode, said resonator layer disposed on said surface, said first electrode disposed on a surface of said resonator layer;

providing a cavity disposed between said substrate and said resonator layer; and providing a second electrode disposed on said substrate and on a surface of said cavity remote from said resonator layer, wherein said second electrode is separated from said resonator layer by a thin gap.

19. A method as claimed in claim 17, wherein said steps of providing said first, second, third, fourth and fifth resonators each comprise steps of:

providing a substrate having a surface;

providing a resonator layer including a first electrode, said resonator layer comprising single-crystal lithium niobate, lithium tantalate or lithium tetraborate and disposed on said surface, said first electrode comprising aluminum and disposed on a surface of said resonator layer;

providing a cavity disposed between said substrate and said resonator layer; and providing a second electrode disposed on said substrate and on a surface of said cavity remote from said resonator layer, wherein said second electrode comprises gold and is separated from said resonator layer by a thin gap.

* * * * *